United States Patent
Lin et al.

(10) Patent No.: US 9,117,878 B2
(45) Date of Patent: Aug. 25, 2015

(54) METHOD FOR MANUFACTURING SHALLOW TRENCH ISOLATION

(71) Applicant: UNITED MICROELECTRONICS CORP., Hsin-Chu (TW)

(72) Inventors: Keng-Jen Lin, Kaohsiung (TW); Yu-Ren Wang, Tainan (TW); Chih-Chung Chen, Tainan (TW); Tsuo-Wen Lu, Kaohsiung (TW); Tsai-Yu Wen, Tainan (TW)

(73) Assignee: UNITED MICROELECTRONICS CORP., Science-Based Industrial Park, Hsin-Chu (TW)

( * ) Notice: Subject to any disclaimer, the term of this patent is extended or adjusted under 35 U.S.C. 154(b) by 149 days.

(21) Appl. No.: 13/710,483

(22) Filed: Dec. 11, 2012

(65) Prior Publication Data

US 2014/0162431 A1    Jun. 12, 2014

(51) Int. Cl.
*H01L 21/76* (2006.01)
*H01L 21/762* (2006.01)
*H01L 21/02* (2006.01)
*H01L 21/321* (2006.01)

(52) U.S. Cl.
CPC .... *H01L 21/76232* (2013.01); *H01L 21/02164* (2013.01); *H01L 21/02219* (2013.01); *H01L 21/02282* (2013.01); *H01L 21/02304* (2013.01); *H01L 21/02326* (2013.01); *H01L 21/02337* (2013.01); *H01L 21/32105* (2013.01)

(58) Field of Classification Search
CPC .......... H01L 2224/03426; H01L 2224/81026; H01L 21/02205; H01L 21/02356; H01L 21/02318; H01L 21/02219; H01L 21/02282; H01L 21/02326; H01L 21/32105

USPC ......... 438/424, 425, 431, 296, 589, 700, 637, 438/672, 675; 257/751, 774

See application file for complete search history.

(56) References Cited

U.S. PATENT DOCUMENTS

| | | | |
|---|---|---|---|
| 5,498,768 | A | 3/1996 | Nishitani |
| 6,063,698 | A | 5/2000 | Tseng |
| 6,251,761 | B1 | 6/2001 | Rodder |
| 6,380,104 | B1 | 4/2002 | Yu |
| 6,492,217 | B1 | 12/2002 | Bai |
| 6,642,066 | B1 | 11/2003 | Halliyal |
| 6,656,852 | B2 | 12/2003 | Rotondaro |
| 6,696,345 | B2 | 2/2004 | Chau |
| 6,818,517 | B1 | 11/2004 | Maes |
| 6,818,553 | B1 | 11/2004 | Yu |
| 6,841,484 | B2 | 1/2005 | Ying |
| 6,921,711 | B2 | 7/2005 | Cabral, Jr. |
| 7,012,027 | B2 | 3/2006 | Perng |
| 7,030,430 | B2 | 4/2006 | Doczy |

(Continued)

*Primary Examiner* — Thanh Y Tran
(74) *Attorney, Agent, or Firm* — Winston Hsu; Scott Margo

(57) ABSTRACT

A method for manufacturing a semiconductor structure includes the following steps. First, a semiconductor substrate is provided and a patterned pad layer is formed on the semiconductor substrate so as to expose a portion of the semiconductor substrate. Then, the semiconductor substrate exposed from the patterned pad layer is etched away to form a trench inside the semiconductor substrate. A selectively-grown material layer is selectively formed on the surface of the trench, followed by filling a dielectric precursor material into the trench. Finally, a transformation process is carried out to concurrently transform the dielectric precursor material into a dielectric material and transform the selectively-grown material layer into an oxygen-containing amorphous material layer.

19 Claims, 5 Drawing Sheets

(56) References Cited

U.S. PATENT DOCUMENTS

| | | |
|---|---|---|
| 7,126,199 B2 | 10/2006 | Doczy |
| 7,135,361 B2 | 11/2006 | Visokay |
| 7,157,378 B2 | 1/2007 | Brask |
| 7,160,767 B2 | 1/2007 | Brask |
| 7,208,366 B2 | 4/2007 | Tsai |
| 7,371,649 B2 | 5/2008 | Cheng |
| 7,381,608 B2 | 6/2008 | Brask |
| 7,384,880 B2 | 6/2008 | Brask |
| 7,488,656 B2 | 2/2009 | Cartier |
| 7,501,336 B2 | 3/2009 | Doyle |
| 7,521,324 B2 | 4/2009 | Ohmi |
| 7,601,648 B2 | 10/2009 | Chua |
| 7,824,990 B2 | 11/2010 | Chang |
| 7,947,551 B1 | 5/2011 | Syue |
| 2004/0007561 A1 | 1/2004 | Nallan |
| 2005/0085047 A1* | 4/2005 | DeLoach et al. ............ 438/424 |
| 2005/0186755 A1* | 8/2005 | Smythe et al. ............ 438/424 |
| 2005/0202624 A1 | 9/2005 | Li |
| 2005/0266655 A1* | 12/2005 | Nemani et al. ............ 438/435 |
| 2005/0275035 A1 | 12/2005 | Mathew |
| 2006/0054943 A1 | 3/2006 | Li |
| 2006/0094192 A1 | 5/2006 | Yang |
| 2006/0172548 A1 | 8/2006 | Wu |
| 2006/0211259 A1 | 9/2006 | Maes |
| 2006/0284271 A1 | 12/2006 | Doyle |
| 2007/0059899 A1* | 3/2007 | Smythe et al. ............ 438/424 |
| 2008/0070395 A1 | 3/2008 | Yen |
| 2008/0157231 A1 | 7/2008 | Wang |
| 2009/0057787 A1 | 3/2009 | Matsuki |
| 2009/0179283 A1 | 7/2009 | Adams |
| 2010/0038751 A1 | 2/2010 | Zhu |
| 2010/0062592 A1 | 3/2010 | Clark |
| 2010/0068877 A1 | 3/2010 | Yeh |
| 2010/0075507 A1 | 3/2010 | Chang |
| 2010/0081262 A1 | 4/2010 | Lim |
| 2010/0184281 A1 | 7/2010 | Hsu |
| 2010/0219481 A1 | 9/2010 | Tseng |

* cited by examiner

METHOD FOR MANUFACTURING SHALLOW TRENCH ISOLATION

BACKGROUND OF THE INVENTION

1. Field of the Invention

The present invention relates generally to a method for manufacturing a semiconductor structure, and more particularly, to a method for manufacturing a semiconductor structure having a selectively-grown material layer on the surface of a trench.

2. Description of the Prior Art

In the present semiconductor processes, a localized oxidation isolation (LOCOS) or a shallow trench isolation (STI) is normally used to isolate the MOS transistors. However, with the reduction in both design size and fabricating line width of the semiconductor wafers, the drawbacks of pits, crystal defects and longer bird's beak in the LOCOS processes will affect even more the characteristics of the semiconductor wafers. The field oxide produced in the LOCOS processes also occupies a larger volume, which affects the integration of the semiconductor wafers. Thus, in the submicron semiconductor process, the STI process is widely used as an isolation technique because of its smaller size and improved integration potential.

The typical fabrication method of a STI is to first form shallow trenches between each MOS device on the surface of the semiconductor wafer, and a dielectric material is then filled into the shallow trenches to achieve electrical isolation function. However, as the size of the semiconductor components shrinks and gets close to their physical limitations, the corresponding decrease of the size of the trenches causes the increased difficult in filling the dielectric material into these trenches. As a result, the way about how to manufacture high performance STI has become one of the important issues in the field of manufacturing semiconductor devices.

SUMMARY OF THE INVENTION

To solve said problems, the present invention provides a method for manufacturing a semiconductor structure, which adopts a dielectric precursor material with preferred gap filling ability and includes a process of forming a selectively-grown material layer on the surface of a trench, especially for the trench used to form a shallow trench isolation structure.

To address these and other objectives, according to one preferred embodiment of the present invention, a method for manufacturing a semiconductor structure is provided, which includes the following steps. First, a semiconductor substrate is provided and a patterned pad layer is formed on the semiconductor substrate so as to expose a portion of the semiconductor substrate. Then, the semiconductor substrate exposed form the patterned pad layer is etched away to form a trench inside the semiconductor substrate. A selectively-grown material layer is selectively formed on the surface of the trench followed by filling a dielectric precursor material into the trench. Finally, a transformation process is carried out to concurrently transform the dielectric precursor material into a dielectric material and transform the amorphous material layer into an oxygen-containing amorphous material layer.

To summarize, the present invention provide a method for manufacturing a semiconductor structure with a trench covered with a selectively-grown material layer. Since the surface of the trench is already covered by the amorphous material layer before dielectric precursor material fills up the trench, in a subsequent transformation process, oxygen atoms diffusing out from the dielectric precursor material or outside environment can be consumed completely by this amorphous material layer rather than diffuse directly into a semiconductor substrate near the trench and therefore reduce the area of the corresponding active regions. Furthermore, since an oxygen-containing amorphous material layer disposed between a dielectric material and the semiconductor substrate can be used to buffer the stress between them, an unnecessary compressive stress imposed on the semiconductor substrate can be therefore reduced effectively.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
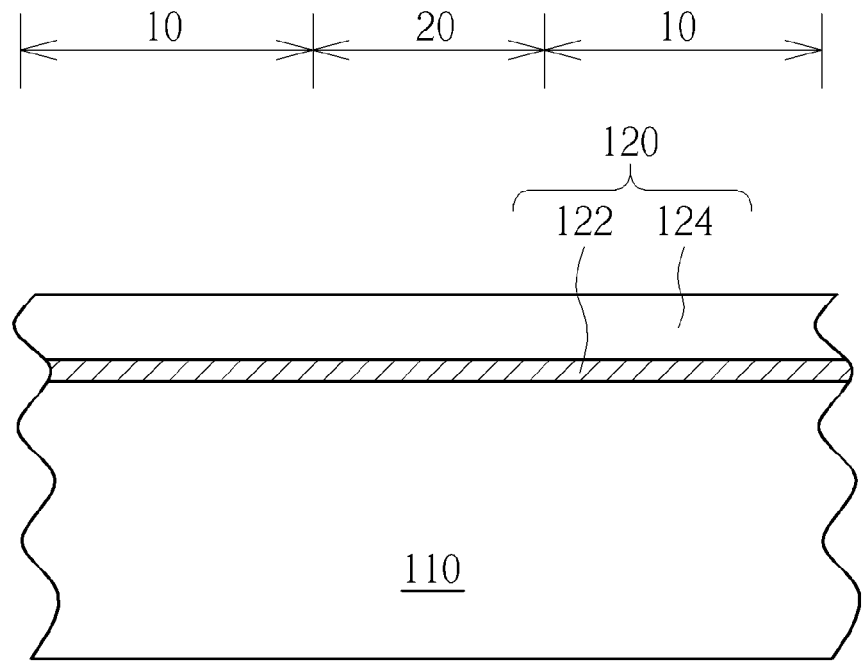
FIGS. 1-10 schematically depict cross-sectional views of a semiconductor process according to embodiments of the present invention.

FIGS. 1 to 10 schematically depict cross-sectional views of a semiconductor process according to an embodiment of the present invention. As shown in FIG. 1, a semiconductor substrate 110 defined with at least an active region 10 and at least an isolation region 20 is provided, which may be used to accommodate electronic devices and electrical isolation structures respectively. Than, a deposition process is carried out to form at least a pad layer (also called hard mask layer) 120 on the semiconductor substrate 110 within the active region 10 and the isolation region 20. In subsequent processes, the pad layer 120 may be further patterned so as to define the pattern of a trench (not shown) within the isolation region 20. According to one preferred embodiment of the present invention, the pad layer 120 may include a pad oxide 122 and a pad nitride 124 from bottom to up. The semiconductor substrate 110 may be a silicon substrate, a silicon containing substrate, a III-V group-on-silicon (such as GaN-on-silicon) substrate, a graphene-on-silicon substrate or a silicon-on-insulator (SOI) substrate, but is not limited thereto.

Figure 2:
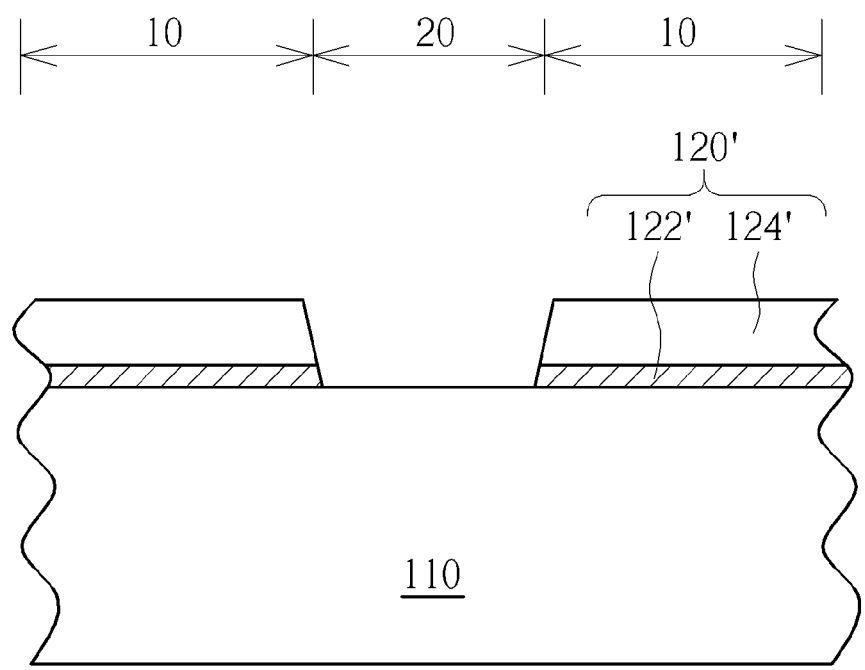

Next, the pad layer 120 is patterned through a pattering process so as to form a patterned pad layer 120' on the semiconductor substrate 110. For the sake of clarity, a method for manufacturing the patterned pad layer 120' according to this embodiment is disclosed as follows. Please refer to FIF. 1 and FIG. 2. First, a patterned photoresist (not shown) is formed on the pad layer 120 by methods such as photolithography. The pattern of the patterned photoresist (not shown) defines the corresponding position of the trench below. Then, an etching process is performed by using the pattern of the patterned photoresist (not shown) as a hard mask. As a result, the patterned pad layer 120' shown in FIG. 2 is formed. After the patterned photoresist (not shown) is selectively removed, a structure shown in FIG. 2 is obtained. Additionally, the patterned pad layer 120' includes a patterned pad oxide 122' and patterned pad nitride 124', which can expose a portion of the semiconductor substrate 110 and define the location of the required trench.

Figure 3:
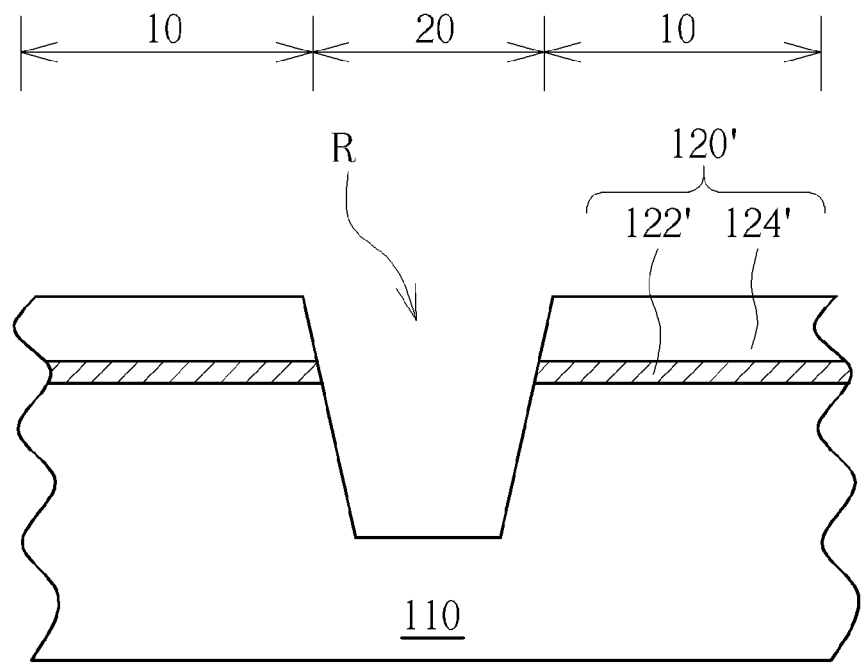

Please refer to FIG. 3. Next, at least an etching process is carried out, such as a dry etching process, to transfer the pattern of the patterned pad layer 120' into the semiconductor substrate 110 and form a trench R within the isolation region 20. It should be noted that, since the trench R is formed inside the semiconductor substrate 110, it is therefore able to expose the interior region of the semiconductor substrate 110, such as a single crystal region. Optionally, a pull-back process is carried out to etch a portion of the patterned pad layer 120' near the opening of the trench R. Through this pull-back process, gap filling ability of the subsequent dielectric precursor material can be improved effectively and the subsequent dielectric material may have enough buffer portion to resist probable over-etch.

Figure 4:
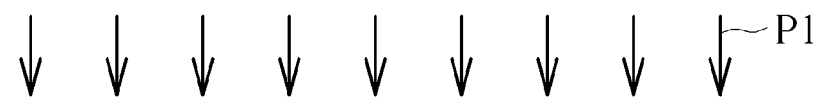
Figure 4:
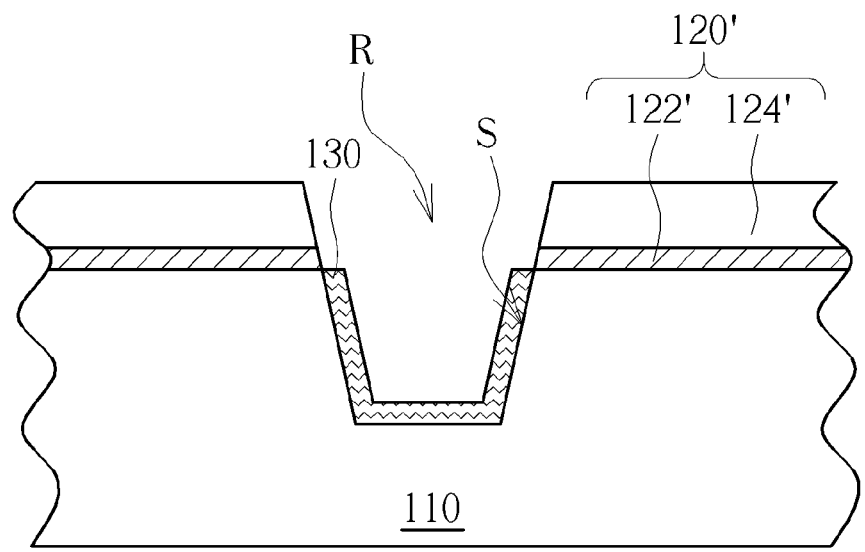
Figure 5:
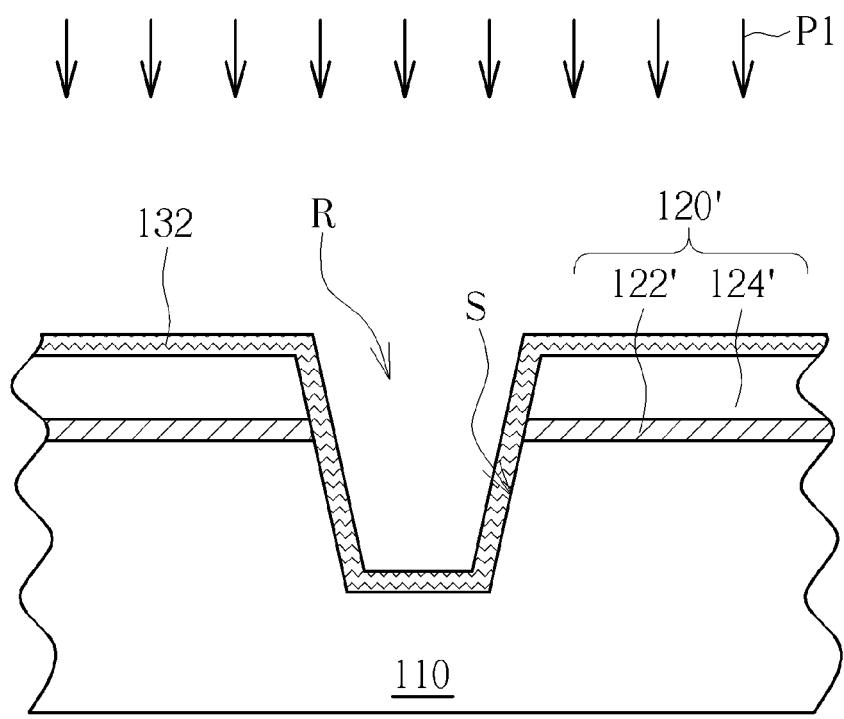

FIG. 4 and FIG. 5 are schematic diagrams respectively showing a semiconductor structure having a trench covered with a selectively-grown material layer or a deposition material. Please refer to FIG. 4; under the coverage of the patterned pad layer 120', at least the selectively-grown material layer 130, such as an amorphous material, and more preferably, an amorphous silicon, is conformally formed on the surface S of the trench R through a selective growth process P1. To put it more concretely, according to one preferred embodiment of the present invention, the selectively-grown material layer 130 may act as both a stress buffer layer and/or a sacrificial layer, that is to say, it can not only buffer the stress between the subsequent dielectric material (not shown) and the semiconductor substrate 110 but also consume active atoms, like oxygen atoms, diffusing from the dielectric material toward the semiconductor substrate 110 during the subsequent transformation process. These characteristics will be described in the following paragraphs. The above mentioned selective growth process P1 is preferably a selective growth process, which may be carried out by means of a co-flow deposition process or a cyclic deposition process. In one case that the cyclic deposition process is carried out, for example, when the selectively-grown material layer 130 is an amorphous silicon material, the silicon source gases and the etching gases are alternately introduced into the reaction chamber and accompanied by the carrier gases at a processing temperature lower than 500° C. The deposition process and the etching process are then performed alternately and repeatedly many times. Consequently, the amorphous silicon material with a thickness ranging from 5 angstrom to 100 angstrom is obtained. It is worth noting that, since the deposition rates of the amorphous silicon material occurring on the surface S of the trench R (i.e. the exposed surface of the semiconductor substrate 110) is higher than that occurring on the patterned pad layer 120', if accompanied with the periodical etching process, the amorphous silicon material can be therefore formed inside the trench R selectively. The silicon source gases include silane ($SH_4$), dichlorosilane ($SiH_2Cl_2$) or other chlorinated compounds, the etching gases include chlorine ($Cl_2$), hydrogen chloride (HCl) or other suitable etching gases, the carrier gases include hydrogen ($H_2$), argon (Ar) or other suitable inert gases. According to various requirements, a liner (not shown), such as an oxide layer and/or a nitride layer, may be formed between the selectively-grown material layer 130 and the semiconductor substrate 110 or formed on the surface of the selectively-grown material layer 130. The liner can be used to buffer the stress between the selectively-grown material layer 130 and the semiconductor substrate 110 or used to improve the adhesivity between them.

According to another preferred embodiment of the present invention, as shown in FIG. 5, a deposition material layer 132 may conformally cover the surface S of the trench R and the surface of the patterned pad layer 120' through a deposition process P1. However, it is worth noting that, if the surface S of the trench R and the surface of the patterned pad layer 120' are simultaneously covered by the deposition material layer 132, a later performed planarization process, which is used to planarize a dielectric material (not shown) outside the trench R, will be negatively affected by the deposition material layer 132 covering of the surface of the patterned pad layer 120'. For example, a two-stage planarization process is required in order to remove the dielectric material and the deposition material layer 132 respectively. Therefore, the selectively-grown material layer 130 is preferably formed on the surface S of the trench R only to constitute a structure as shown in FIG. 4.

Figure 6:
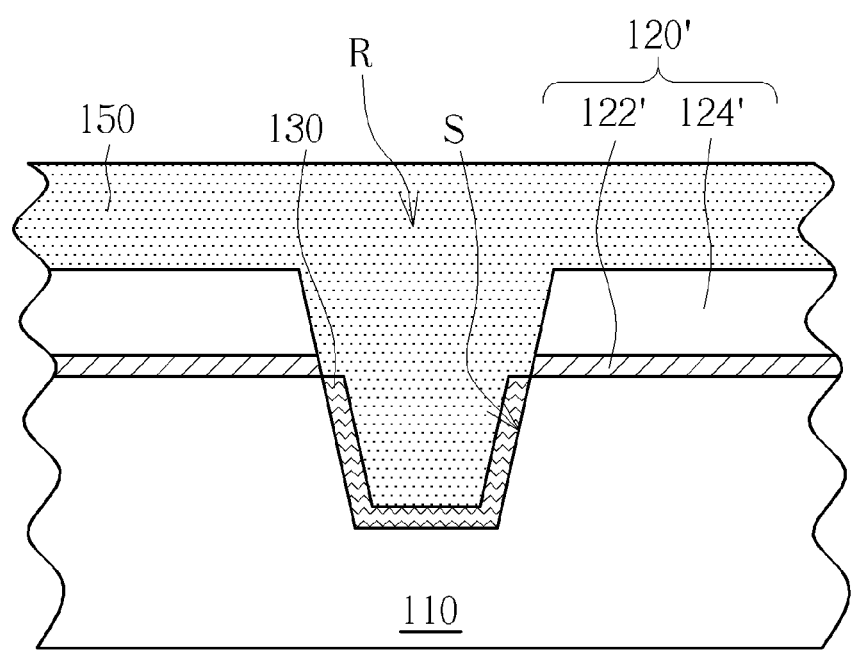

Please refer to FIG. 6. Subsequently, a filling process is carried out to have a dielectric precursor material 150 fill into the trench R. As the continuous shrinkage in the size of semiconductor devices, the aspect ratio of the trench R is increased inevitably (e.g. a depth of the recess R may be approximately 3000 Å while the opening diameter of the recess R may be approximately only 500 Å). Thus, as the dielectric precursor material 150 is under liquid state, the recess R can be filled with the dielectric precursor material 150 completely. For example, processes for filling the dielectric precursor material 150 may include a flowable chemical vapor deposition (FCVD) process or a spin-on dielectric (SOD) process. According to the preferred embodiment of the invention, the dielectric precursor material 150 preferably includes silyl amine compounds, such as trisilylamine (TSA), but is not limited thereto.

Subsequently, a transformation process is carried out to transform the dielectric precursor material into a dielectric material and to transform the selectively-grown material layer into an oxygen-containing amorphous material layer; the detailed description of these will be described as follows. Please refer to FIG. 7 accompanied with FIG. 6. The transformation process P2 is carried out so that the selectively-grown material layer 130 shown in FIG. 6 can be transformed into an oxygen-containing amorphous material layer 140. In addition, the transformation process P2 may be one of the sub-steps or may be a subsequent step of the above-mentioned FCVD process or SOD process, which includes at least an oxidation process and a densification process. For example, when using a FCVD process, after liquid silyl amine compounds are filled into the trench R, an oxidation process may be sequentially carried out to cure these liquid silyl amine compounds and form several —Si—O—Si— bonds among the silyl amine compounds. Finally, a densification process is carried out to further densify the cured silyl amine compounds. Through this way, a densified silicon oxide structure will be formed inside the trench R. It should be noted that oxygen gas (O2), ozone gas (O3) or steam (H2O) may be imported during both the oxidation process and the densification process, and the processing temperature of these two processes may be respectively within a range of 500° C.~700° C. and higher than 1000° C.

According to a current manufacturing method, when a transformation process is carried out, oxygen atoms may inevitably diffuse from the interior of a trench toward a semiconductor substrate near the trench, which will cause the reduction of the area of the active region. Additionally, when the dielectric precursor material is transformed into the dielectric material, it volume will increases slightly and imposes a compress stress onto the semiconductor substrate near the trench. In contrast, according to a preferred embodiment of the present invention, since the selectively-grown material layer 130 is disposed between the semiconductor substrate 110 and the dielectric precursor material 150 before the transformation process P2 is carried out, the oxygen atoms diffusing from the interior of the trench R may be consumed completely by the selectively-grown material layer 130. Still referring to FIG. 6 and FIG. 7, for example, when the selectively-grown material layer 130 is an amorphous silicon layer, the oxygen atoms diffusing from the interior of the trench R may react with a portion of, or the entire the amorphous silicon layer to therefore form silicon oxide. Consequently, an oxygen-containing amorphous material layer 140 is formed and the composition of which may include amorphous silicon and/or silicon oxide. It should be noted that the oxygen content inside the oxygen-containing amorphous material layer 140 has a gradient distribution. More precisely, the gradient distribution decreases from the contact surface S1 between the dielectric material 160 and the oxygen-containing amorphous material layer 140 toward the contact surface S2 between the trench R and the oxygen-containing amorphous material layer 140. This characteristic will be described in detail in the following paragraph.

Figure 7:
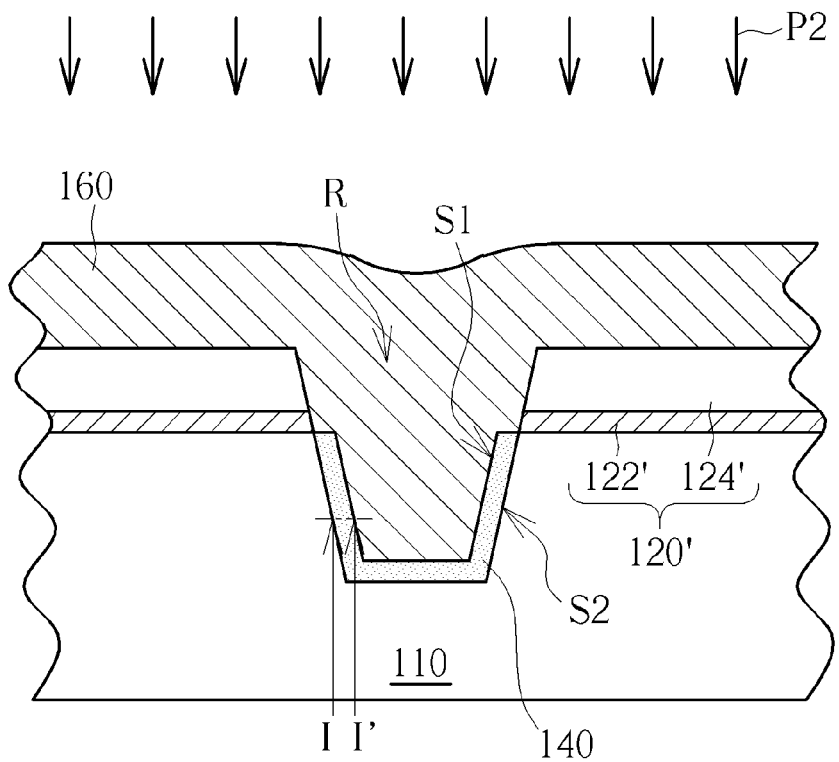
Figure 8:
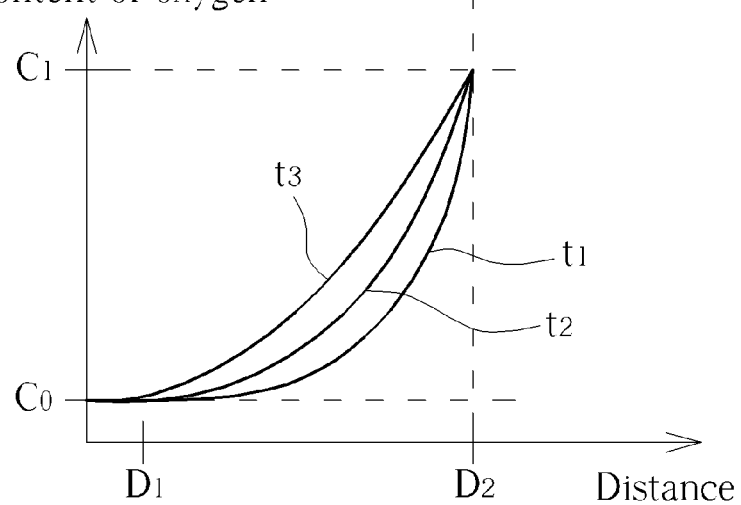

FIG. 8 is a diagram showing the relationship between the oxygen content and the corresponding position inside the oxygen-containing amorphous material layer taken along a line I-I' as shown in FIG. 7. In FIG. 8, D1 corresponds to C0 and D2 corresponds to C1, wherein D1 indicates a position located on the contact surface S1 or inside the oxygen-containing amorphous material layer near the contact surface S1; and D2 indicates a position located on the contact surface S2 or inside the oxygen-containing amorphous material layer near the contact surface S2. C1 and C0 respectively indicate the oxygen content inside the oxygen-containing amorphous material layer, wherein preferably C1≥C0≥0. Additionally, t1, t2, t3 shown in FIG. 8 respectively indicate a transformation duration time, wherein preferably 0<t1<t2<t3. Please refer to FIG. 8 accompanied with FIG. 7. During a certain transformation duration time, like t1, at least a portion of the amorphous material may react with active atoms, such as oxygen atoms, to produce silicon oxide. As a result, the oxygen content inside oxygen-containing amorphous material layer 140 will have a gradient distribution and the gradient distribution will decrease from the contact surface S1 between the dielectric material 160 and the oxygen-containing amorphous material layer 140 toward the contact surface S2 between the trench R and the oxygen-containing amorphous material layer 140.

More precisely, the ratio of silicon oxide/amorphous silicon near the contact surface S1 is higher than the ratio of silicon oxide/amorphous silicon near the contact surface S2. When the transformation duration time increases, from t2 to t3 for example, the oxygen content inside the oxygen-containing amorphous material layer 140 between the D1 and D2 will increase continuously. That is to say, more and more amorphous silicon material will be transformed into silicon oxide when the transformation duration time increases. According to one preferred embodiment of the present invention, the oxygen atoms will be consumed completely before they diffuse to the contact surface S2, so that they will not diffuse into the semiconductor substrate 110 near the contact surface S2. Consequently, after a sufficiently long transformation duration time, the concentration of oxygen inside the oxygen-containing amorphous material layer 140 between the D1 and D2 will reach the concentration of C1. That is to say, all of the selectively-growth silicon material inside the oxygen-containing amorphous material layer 140 will be transformed into silicon oxide material, but is not limited thereto. Thanks to this mechanism, the semiconductor substrate 110 within the active regions 10 will not be consumed during the transformation process P2. It is worth noting that, since the selectively-grown material layer 130 has a loose structure, the free oxygen atoms inside the selectively-grown material layer 130 can diffuse easily and react with other atoms uniformly. As a result, even though the oxygen-containing amorphous material layer 140 is formed afterwards, it will not induce unnecessary stress to the active regions.

Figure 9:
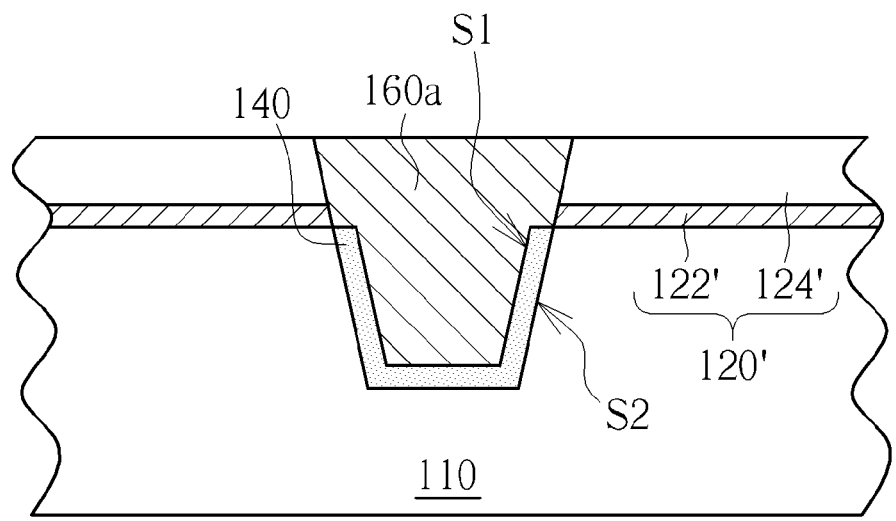

Subsequently, the dielectric material 160 is planarized until the exposure of the patterned pad layer 120' so that a planarized dielectric material 160a and a planarized patterned pad layer 120' are formed as shown in FIG. 9. It is worth noting that, according to one preferred embodiment of the present invention, since the surface of the patterned pad layer 120' is not covered by the selectively-growth material layer (not shown), the planarization process can be performed continuously until the surface of the patterned pad layer 120' is exposed. That is say. Through this embodiment, no selectively-growth material layer is needed to be removed by the planarization process and therefore only a one-stage planarization process is needed.

Figure 10:
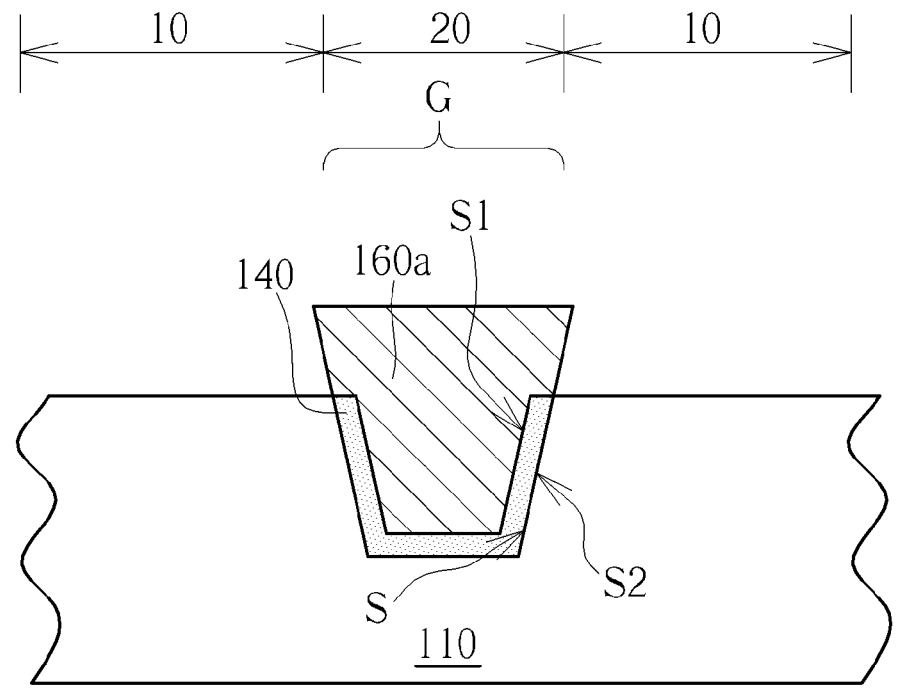

Finally, the patterned pad layer 120' is removed completely so as to form a shallow trench isolation G within the isolation region 20 as shown in FIG. 10. This shallow trench isolation G may include the dielectric material 160a and the oxygen-containing amorphous material layer 140. After the above-mentioned processes, subsequent other semiconductor processing procedures may be further carried out to form required devices within the active regions. Since these procedures are well-known to those skilled in the art, they are therefore not described in detail for the sake of convenience and brevity.

To summarize, the present invention provide a method for manufacturing a semiconductor structure where a trench R covered with a selectively-grown material layer 130 is provided. Since the surface S of the trench R is already covered by the selectively-grown material layer 130 before a dielectric precursor material 150 fills up the trench R, in a subsequent transformation process P2, active atoms, like oxygen atoms, diffusing out from the dielectric precursor material 150 or outside environment can be consumed completely by this selectively-grown material layer 130 rather than diffuse directly into a semiconductor substrate 110 near the trench R and further reduce the area of the corresponding active regions 10. Furthermore, since an oxygen-containing amorphous material layer 140 disposed between a dielectric material 160 and the semiconductor substrate 110 can be used to buffer the stress between them, an unnecessary compressive stress imposed on the semiconductor substrate 110 can be therefore reduced effectively.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for manufacturing a semiconductor structure, comprising:
   providing a semiconductor substrate;
   forming a patterned pad layer on the semiconductor substrate so as to expose a portion of the semiconductor substrate;
   etching the semiconductor substrate exposed from the patterned pad layer to form a trench;
   selectively forming a selectively-grown material layer on a surface of the trench;
   filling a dielectric precursor material into the trench; and
   performing a transformation process so as to concurrently transform the dielectric precursor material into a dielectric material and transform the selectively-grown material layer into an oxygen-containing amorphous material layer, wherein the dielectric precursor material is under liquid state before the transformation process is performed.

2. The method according to claim 1, wherein the selectively-grown material layer is disposed on the surface the trench only.

3. The method according to claim 1, wherein a process for forming the selectively-grown material layer comprises a selective growth process.

4. The method according to claim 1, wherein a process for forming the selectively-grown material layer comprises a co-flow deposition process or a cyclic deposition process.

5. The method according to claim 1, wherein a processing temperature for forming the selectively-grown material layer is lower than 500° C.

6. The method according to claim 1, wherein the selectively-grown material layer is an amorphous silicon material layer.

7. The method according to claim 1, wherein a thickness of the selectively-grown material layer is within a range of 5 angstrom to 100 angstrom.

8. The method according to claim 1, further comprising performing a pull-back process onto the patterned pad layer before forming the selectively-grown material layer.

9. The method according to claim 1, further comprising forming a liner layer on the surface of the trench before forming the selectively-grown material layer.

10. The method according to claim 1, wherein the dielectric precursor material comprises trisilylamine (TSA).

11. The method according to claim 1, wherein processes for filling the dielectric precursor material comprise a flowable chemical vapor deposition (FCVD) process or a spin-on dielectric (SOD) process.

12. The method according to claim 1, wherein the transformation process comprises an oxidation process.

13. The method according to claim 12, wherein the oxidation process comprises importing oxygen gas, ozone gas or steam.

14. The method according to claim 1, wherein the transformation process comprises a densification process so as to densify the dielectric material and the oxygen-containing amorphous material layer.

15. The method according to claim 1, wherein a processing temperature of the transformation process is within a range of 500° C.~700° C.

16. The method according to claim 1, wherein an oxygen content inside the oxygen-containing amorphous material layer has a gradient distribution after the transformation process.

17. The method according to claim 16, wherein the gradient distribution decreases from a contact surface between the dielectric material and the oxygen-containing amorphous material layer toward a contact surface between the trench and the oxygen-containing amorphous material layer.

18. The method according to claim 1, further comprising performing a planarization process after performing the transformation process, so as to remove the dielectric material outside the trench.

19. The method according to claim 1, wherein a composition of the oxygen-containing amorphous material layer comprises amorphous silicon and silicon oxide.

* * * * *